(12) United States Patent
Muro et al.

(10) Patent No.: US 10,243,329 B2
(45) Date of Patent: Mar. 26, 2019

(54) EXTERNAL RESONATOR LASER

(71) Applicant: NATIONAL UNIVERSITY CORPORATION CHIBA UNIVERSITY, Chiba-shi, Chiba (JP)

(72) Inventors: Kiyofumi Muro, Chiba (JP); Yuji Wakabayashi, Chiba (JP); Tomohisa Endo, Chiba (JP); Ken Kitahara, Chiba (JP)

(73) Assignee: NATIONAL UNIVERSITY CORPORATION CHIBA UNIVERSITY, Chiba-shi, Chiba (JP)

( * ) Notice: Subject to any disclaimer, the term of this patent is extended or adjusted under 35 U.S.C. 154(b) by 0 days.

(21) Appl. No.: 14/430,054

(22) PCT Filed: Sep. 19, 2013

(86) PCT No.: PCT/JP2013/075256
§ 371 (c)(1),
(2) Date: Aug. 20, 2015

(87) PCT Pub. No.: WO2014/046161
PCT Pub. Date: Mar. 27, 2014

(65) Prior Publication Data
US 2015/0349492 A1 Dec. 3, 2015

(30) Foreign Application Priority Data
Sep. 21, 2012 (JP) .................. 2012-208354

(51) Int. Cl.
*H01S 5/14* (2006.01)
*H01S 5/065* (2006.01)
(Continued)

(52) U.S. Cl.
CPC .............. *H01S 5/143* (2013.01); *H01S 3/105* (2013.01); *H01S 5/02252* (2013.01);
(Continued)

(58) Field of Classification Search
CPC ......... H01S 5/145; H01S 5/143; H01S 5/1453
See application file for complete search history.

(56) References Cited

U.S. PATENT DOCUMENTS

| 5,319,668 A | 6/1994 | Luecke |
| 5,867,512 A * | 2/1999 | Sacher .................. H01S 5/143 |
| | | 372/107 |

(Continued)

FOREIGN PATENT DOCUMENTS

| EP | 2 521 226 A1 | 11/2012 |
| JP | 2000164981 A | 6/2000 |

(Continued)

OTHER PUBLICATIONS

International Search Report issued in Application No. PCT/JP2013/075256 with English translation, dated Dec. 3, 2013 (5 pages).
(Continued)

*Primary Examiner* — Michael Carter
(74) *Attorney, Agent, or Firm* — Flynn Thiel, P.C.

(57) ABSTRACT

A tunable external resonator laser is mode-hop-free for broadband and has a laser chip which emits light; a lens which collimates the light emitted from the laser chip, a diffraction grating which diffracts the light collimated by the lens, a support body to which the diffraction grating is fixed, and a movable mirror which reflects the light diffracted by the diffraction grating, wherein the diffraction grating is arranged a prescribed distance apart from a Littman-type tunable external resonator laser arrangement in which the movable mirror rotates on a pivot which is the intersection point of the surface of said movable mirror and the surface of the diffraction grating.

7 Claims, 23 Drawing Sheets

(51) Int. Cl.
   *H01S 3/105* (2006.01)
   *H01S 5/022* (2006.01)
   *H01S 5/10* (2006.01)

(52) U.S. Cl.
   CPC .......... *H01S 5/0653* (2013.01); *H01S 5/0654* (2013.01); *H01S 5/1039* (2013.01)

(56) References Cited

U.S. PATENT DOCUMENTS

| | | | |
|---|---|---|---|
| 6,614,829 B1 | 9/2003 | Tuganov et al. | |
| 6,625,183 B1 | 9/2003 | Hand et al. | |
| 6,912,235 B2* | 6/2005 | Anthon | H01S 5/141 372/18 |
| 9,042,422 B2* | 5/2015 | Muro | H01S 5/143 372/102 |
| 2003/0026302 A1 | 2/2003 | Anthon et al. | |
| 2013/0177033 A1 | 7/2013 | Muro et al. | |

FOREIGN PATENT DOCUMENTS

| | | |
|---|---|---|
| WO | WO 03/012939 A1 | 2/2003 |
| WO | WO 2011/081212 A1 | 7/2011 |

OTHER PUBLICATIONS

Wakabayashi et al., Performances of 1 μm Band Prototype Tunable Diode Laser, Japan Society of Applied Physics, Sep. 14, 2012 with English translation (5 pages).
M. de Labachelerie et al., Mode-hop suppression of Littrow grating-tuned lasers, Applied Optics, Jan. 20, 1993, vol. 32, No. 3, pp. 269-274 with Technical Notes from Applied Optics, Jun. 20, 1994, vol. 33, No. 18, pp. 3816-3819.
Karen Liu et al., Novel geometry for single-mode scanning of tunable lasers, Optics Letters, Mar. 1981, vol. 6, No. 3, pp. 117-118.
A.T. Semenov et al., Wide Spectrum Single Quantum Well Superluminescent Diodes at 0.8 μm with Bent Optical Waveguide, Electronics Letters, May 13, 1993, vol. 29, No. 10, pp. 854-856.
D.E. Aspnes et al., Optical properties of $Al_xGa_{1-x}As$, J. Appl. Phys. 60(2), Jul. 15, 1986, pp. 754-767.
T. Fujimoto et al., High power InGaAs/AlGaAs laser diodes with decoupled confinement heterostructure, SPIE 3628, pp. 38-45 (1999).
K. Muro et al., High Power and Widely Tunable External Cavity Diode Laser with a Single-Angled-Facet Laser Chip, Proceeding of Intern. Conference of Laser and Electro-Optics, CWN4, May 5, 2010, San Jose.
K. Muro, et al., ASE-Free Continuously Tunable Diode Laser with a Novel Configuration, Proceeding of Intern. Conference of Laser and Electro-Optics, CTU3.3, May 8, 2012, San Jose.

* cited by examiner

EXTERNAL RESONATOR LASER

TECHNICAL FIELD

The present invention relates to tunable external resonator laser. More specifically, the present invention relates to mode-hop-free tunable external resonator laser which corrects group velocity dispersion.

BACKGROUND ART

A tunable laser is very useful in the field of spectrometry for various materials and optical elements, and measurement for environment and medical treatment.

The tunable external resonator laser is one of the tunable lasers.

The tunable external resonator laser has an optical gain medium such as semiconductor laser chip, and has an optical element which has a frequency discrimination function such as a diffraction grating. The tunable external resonator laser can freely control the oscillation wavelength.

Specially, the tunable external resonator laser using a gain medium, such as a laser diode, and can oscillate light with a wide wavelength range. Further, it has an advantage that it can be made small, strong and relatively inexpensive.

Namely, the tunable external resonator laser can be used for many applications.

There are many kinds of tunable external resonator lasers.

Specially, the mode-hop-free laser which can continuously control the oscillation wavelength is very important for spectrometry because accurate spectrometry can be achieved by suppressing the mode-hop.

Furthermore, mode-hop free tuning is necessary in the case of an automatic calibration for the oscillation wavelength of the tunable resonator laser using the Fabry-Perot resonance pattern, such as a solid etalon, and locking the oscillating frequency of the tunable resonator laser.

A Littrow-type tunable external resonator laser and a Littman-type tunable external resonator laser are known as mode-hop-free lasers.

The Littman-type tunable external resonator laser comprises a diffraction grating like the Littrow-type tunable external resonator laser. However, the Littrow-type rotates a diffraction grating against a laser beam, on the other hand, in the Littman-type tunable external resonator laser, the diffraction grating is fixed against the laser beam.

Therefore, it is possible to secure the area of the laser light which is incident on the diffraction grating, and to realize a small and high-resolution resonator arrangement.

As a result, it is widely used as a tunable resonator laser because it has an advantage that the emission direction of the output light is not changed, even if the wavelength is changed.

Non-Patent Document 1 disclose a Littrow-type tunable external resonator laser.

Furthermore, Non-Patent Document 2, Patent Document 1, 2 and 3 discloses a Littman-type tunable external resonator laser.

A Littman-type tunable external resonator laser is a typical tunable external resonator laser because it is possible to tune a wavelength widely and continuously, and suppresses the power variation of the output light, even if wavelength tuning is performed.

REFERENCES FOR PRIOR ARTS

Patent Document

Patent Document 1 U.S. Pat. No. 5,319,668
Patent Document 2 U.S. Pat. No. 6,625,183
Patent Document 3 U.S. Pat. No. 6,614,829
Patent Document 4 WO/2011/081212

Non-Patent Document

Non-Patent Document 1 M. de Labachelerie and G. Passedat "Mode-hop suppression of Littrow grating-tuned lasers", applied Optics Vol. 32, no. 3, 269(1993), Vol. 33, No. 18, 3817(1994)
Non-Patent Document 2 Liu and Littman, "Novel Geometry for single-mode scanning of tunable lasers", Optics Letters Vol. 6, no. 3, 117(1981)
Non-Patent Document 3 A. T. Semenov, V. R. Shidolovski and S. A. Safin, "Wide Spectrum Single Quantum Well Superluminescent Diodes at 0.8 mm with Bent Optical Waveguide", Electron. Lett. 29, 854-856(1993).
Non-Patent Document 4 D. E. Aspenes et. al., "Optical Properties of $Al_xGa_{1-x}As$", J. Appl. Phys., 60, p.754 (1986)
Non-Patent Document 5 T. Fujimoto, Y. Yamada, Y. Yamada, A. Okubo, Y. Oeda and K. Muro, "High Power InGaAs/AlGaAs Laser Diodes with Decoupled Confinement Heterostructure", SPIE 3625, p.38-45(1999).
Non-Patent Document 6 K. Muro, Y. Shimada, K. Kitahara, T. Endo, Y. Yamagata, Y. Yamada and T. Fujimoto, "High Power and widely tunable external cavity laser with a single-angled-facet laser chip", Proceeding of Intern. Conference of Laser and Electro-Optics, CWN4, May 5, 2010, San Jose.
Non-Patent Document 7 K. Muro, T. Endo, A. Terayama, K. Kitahara, Y. Shimada and D. Fukuoka, "ASE-free Continuously Tunabloe Diode Laser with a Novel Configuration", Proceeding of Intern. Conference of Laser and Electro-Optics, CTU3.3, May 8, 2012, San Jose

DESCRIPTION OF THE INVENTION

Problems to be Solved by the Invention

The Littman-type tunable external resonator laser which is designed for continuous wavelength tuning has a geometrical arrangement in which the resonance wavelength and the resonator length are adjustable but the ratio of the resonance wavelength to the resonator length is a constant value.

However, the actual laser is affected by the refractive index dispersion because the actual laser has a gain media such as dye or semiconductor in the resonator.

In a dye laser, since the thickness of the dye, which is the active medium, is thin and the refractive index is small, there is no problem in particular.

However, a laser diode which uses a semiconductor as an active medium has a high refractive index and thick optical thickness. Therefore, wide mode-hop-free tuning is difficult.

In a 1.5 μm band of optical communication, products with mode-hop-free tuning valid for about 100 nm are commercially available.

However, they are only available by using a short laser chip which is 1 mm or shorter. The reason is that since the wavelength is long, the tolerance for the optical path length change is high, and the refractive index dispersion is relatively small.

Therefore, the output power is limited to about 10 mW.

When the wavelength becomes short, since the deviation of the resonator length, which causes mode-hop, becomes smaller, and the refractive index dispersion increases, Mode-hop-free tuning becomes extremely difficult.

Practically, the mode-hop-free tuning region of the tunable resonator lasers which are commercially available is limited to about 30 nm in a 1 μm band or 10 nm or less in the visible region.

The tunable resonator laser having a high power output and tuning ability for broadband is required in all wavelength ranges.

On the other hand, it is necessary to use a laser diode which has a long chip length to obtain a high power output.

For obtaining a high power output performance and wide gain-bandwidth, it is necessary to use a laser diode whose chip length is long.

However, the long chip length makes the change of the optical length by chromatic dispersion of the refractive index large.

Thus, there is a problem that the mode-hop-free tuning range becomes narrower.

Therefore, the present invention provides a tunable external resonator laser which corrects the group velocity dispersion of a collimation lens and a laser diode which causes mode-hop, even in the short wavelength range whose refractive index dispersion is large.

Solution to the Problems

A tunable external resonator laser of the first aspect of the present invention which solves the above problems comprises, a laser chip which emits light, a lens which collimates the light emitted from the laser chip, a diffraction grating which diffracts the light collimated by the lens, a support body which the diffraction grating is fixed, and a movable mirror which reflects the light diffracted by said diffraction grating.

Further, in the tunable external resonator laser, from the Littman-type tunable external resonator laser arrangement in which the movable mirror is rotated on a pivot which is the intersection of the surface which the movable mirror belongs and the surface which the diffraction grating surface belongs, the diffraction grating being moved in parallel from the movable mirror by a specified distance.

Furthermore, a tunable external resonator laser of the second aspect of the present invention comprises a laser chip which emits light, a lens which collimates the light emitted from the laser chip, a diffraction grating which diffracts the light which is collimated by the lens, a support body to which the diffraction grating is fixed, a movable mirror which reflects the light which is diffracted by the diffraction grating.

Further, in the tunable external resonator laser, the pivot is moved in parallel from the grating surface to the mirror.

However, the parallel movements of the mirror and the movable mirror just give the offsets of a specified value, and they do not change the β dependence of the resonator length.

Further, in the tunable external resonator laser, from the tunable external resonator laser arrangement in which the movable mirror is rotated on a pivot which is parallel to the intersection of the diffraction grating surface and the mirror surface, the pivot is moved in parallel from the grating surface side to the mirror surface side for a specified distance.

Furthermore, in the first and the second aspect of the invention, the tunable external resonator laser further comprises a half mirror which reflects part of the incident light and transmits another part of said incident light and is used as the resonator end. Further the half mirror is fixed, and the laser chip, the lens and the support body is rotated around the pivot.

Furthermore, in the first or the second aspect, but not necessary to be regarded as a restriction, it is preferable that the offset DG of the grating surface and the pivot is defined from the following formula.

$$D_G = \left( \left. \frac{d^2 n_1(\lambda)}{d\lambda^2} \right|_{\lambda_0} l + \left. \frac{d^2 n_2(\lambda)}{d\lambda^2} \right|_{\lambda_0} t \right) \left( \sqrt{1 - \left( \frac{\lambda_0}{d} - \sin\alpha \right)^2} \right)^3 d^2 \quad \text{[formula 1]}$$

In the above formula, $\lambda_0$ is the designed center wavelength, $n_1(\lambda)$ is the effective refractive index dispersion of waveguide mode of a laser chip, $n_2(\lambda)$ is the refractive index of a collimation lens, $d^2n_1(\lambda)/d\lambda^2$ and $d^2n_2(\lambda)/d\lambda^2$ is respectively the quadratic differential coefficient of each refractive index. l is the chip length of a laser chip, t is the effective thickness of a collimation lens, d is the spacing of the grooves of a diffraction grating, $\alpha$ is the incident angle which the collimated light enters into the diffracting grating.

Furthermore, in the first or the second aspect of the present invention, it is preferable that the tunable external resonator laser further comprises a device which can rotate the diffraction grating on the center of the light so as to perpendicular to the incident angle.

Furthermore, in the first or the second aspect of the present invention, it is preferable that the tunable external resonator laser further comprises a device which can perform a translational motion for the diffraction grating or the laser diode, along with the optical axis.

Effects of the Invention

Therefore, by the present invention, a tunable external resonator laser which can correct the group velocity dispersion which causes the mode-hop in the laser diode and collimation lens can be achieved.

BEST MODE FOR CARRYING OUT THE PRESENT INVENTION

Hereafter, embodiments and principles of the present invention are described with reference to the drawings. However, the present invention can be accomplished with different embodiments and is not limited to the descriptions of the embodiments and examples below.

Figure 1:
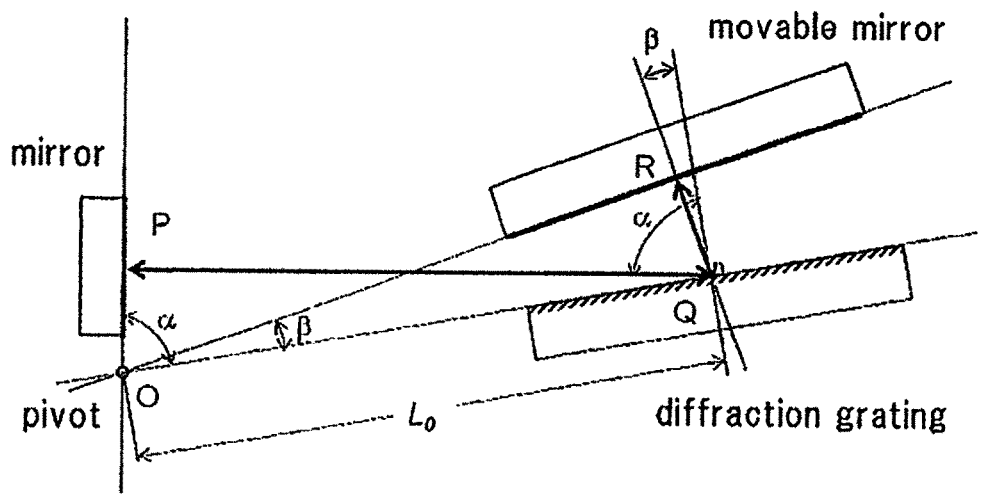
FIG. 1 shows a structure of a tunable external resonator laser of Littman-type arrangement.

FIG. 1 shows a structure of a Littman-type tunable external resonator laser which is described in non-patent document 2.

The Littman-type tunable external resonator laser comprises a diffraction grating, a movable mirror and another mirror.

Specifically, first, the movable mirror reflects the primary diffracted light which enters the diffraction grating with an incident angle α, along a horizontal direction.

Next, a mirror which is placed opposite to the movable mirror reflects the reverse driving light which was diffracted by the diffracting grating.

As a result, a resonator will be constituted.

In this case, the travel direction of the light which is incident to the diffraction grating is perpendicular to the grooves of the diffraction grating.

In this arrangement, the resonator is composed so that the extension of the diffraction grating surface and the extension of the reflective surfaces of two mirror intersect, and the movable mirror rotates on the intersection line which is the pivot.

Consequently, when the angle between the diffraction grating surface and the mirror reflection surface is p, the wavelength which configures the resonator against the primary diffracted light of the diffraction grating is expressed as below formula.

$$\Delta = d(\sin \alpha + \sin \beta) \qquad \text{formula 2}$$

Furthermore, in this case, as is evident from geometrical investigation, the resonance wavelength (L=PQ+RQ) is defined from the following formula when the distance Lo between the pivot O and the center Q of the beam on the diffraction grating surface.

As is evident from geometrical investigation, the resonance wavelength (L=PQ+RQ) is defined from the following formula when the distance Lo is defined as the distance between the pivot O and the center Q of the beam on the diffraction grating surface.

Furthermore, as is evident from the geometrical investigation, in this case, the resonance wavelength (L=PQ+RQ) are given as following formula. In the following formula, $L_0$ is the distance between the pivot O and the center of the light Q on the diffraction grating surface.

$$L = L_0(\sin \alpha + \sin \beta) \qquad \text{formula 3}$$

As described above, when the resonance wavelength of the resonator is changed by changing the angle β between the diffraction grating surface and the movable mirror, the resonator length is changed in proportion to the wavelength. Therefore, the number of the nodes of the electromagnetic wave which is formed in the resonator remains constant.

Figure 2:
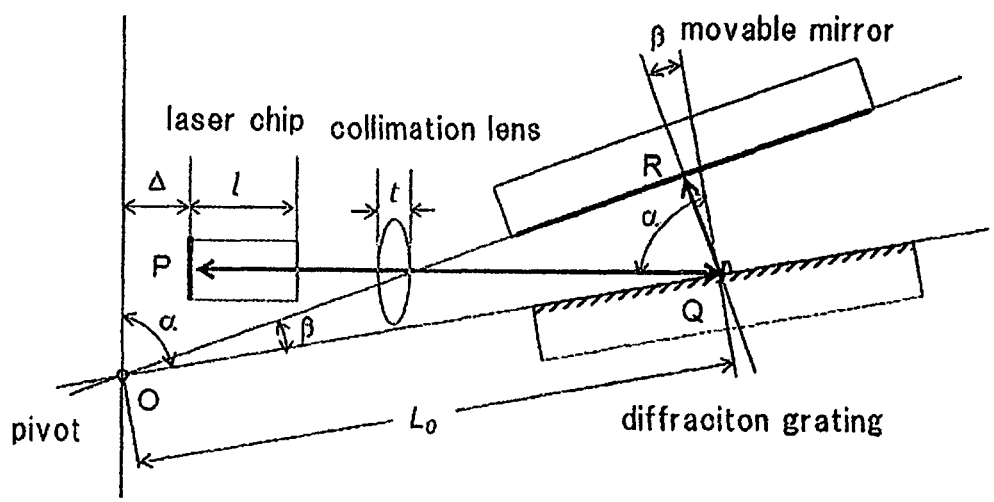
FIG. 2 shows a structure of a Littman-type resonator using a laser diode.

Incidentally, when the arrangement uses a laser diode as a gain medium, the arrangement will be generally the arrangement as FIG. 2 shows.

In this arrangement, a laser diode which has a high reflective coating at one end surface and a low-reflective coating at the other end surface, or a laser diode having an inclined end surface by introducing a curved waveguide, which reduces a residual reflectance, is set. Further, the collimation lens collimates the light from the laser diode and guides the light to the diffraction grating.

In this case, generally, the resonator is composed between the high reflective end surface and the movable mirror, and is adjusted against the primary diffracted light of the diffraction grating.

In this case, since the effective refractive index of the waveguide mode of the laser diode $n_2(\lambda)$ or the refractive index of the collimation lens $n_2(\lambda)$ is greater than 1.

Therefore, for achieving mode-hop-free tuning, it is necessary that the high reflective surface of the laser diode is moved in the direction in which the resonator length becomes shorter by Δ, as this figure shows.

If the refractive index dispersion of the laser diode and collimation lens can be ignored, this value will be expressed in following formula.

$$\Delta = (n_1(\lambda)-1)l + (n_2(\lambda)-1)t \qquad \text{formula 4}$$

However, practically, it is difficult to achieve mode-hop-free tuning for broadband because the waveguide mode of the laser diode and the collimation lens, especially the laser diode, has a strong wavelength dispersion.

Incidentally, the effective refractive index of the waveguide mode of a laser diode is represented by the following formula using a Taylor expansion around a center wavelength.

$$n_1(\lambda) = n_1(\lambda_0) + \left.\frac{dn_1(\lambda)}{d\lambda}\right|_{\lambda_0} \Delta\lambda + \frac{1}{2}\left.\frac{d^2 n_1(\lambda)}{d\lambda^2}\right|_{\lambda_0} (\Delta\lambda)^2 + \ldots \qquad \text{formula 5}$$

The effective refractive index of waveguide mode of a semiconductor laser can be obtained by an eigenvalue analysis using the refractive index of the material which constitutes the waveguide.

Furthermore, the wavelength dependence of the refractive index of the semiconductor is exactly measured. For example, the wavelength dependence of the refractive index of $Al_xGa_{1-x}As$ mixed crystal system is described in the above Non-Patent Document 4.

The waveguide structure of the 1 μm band laser diode chip, which is used in example 1, is described in Non-Patent Document 5. The effective refractive index of the waveguide mode can be approximated by the refractive index of GaAs, which is used in the waveguide layer of the laser chip.

Figure 3:
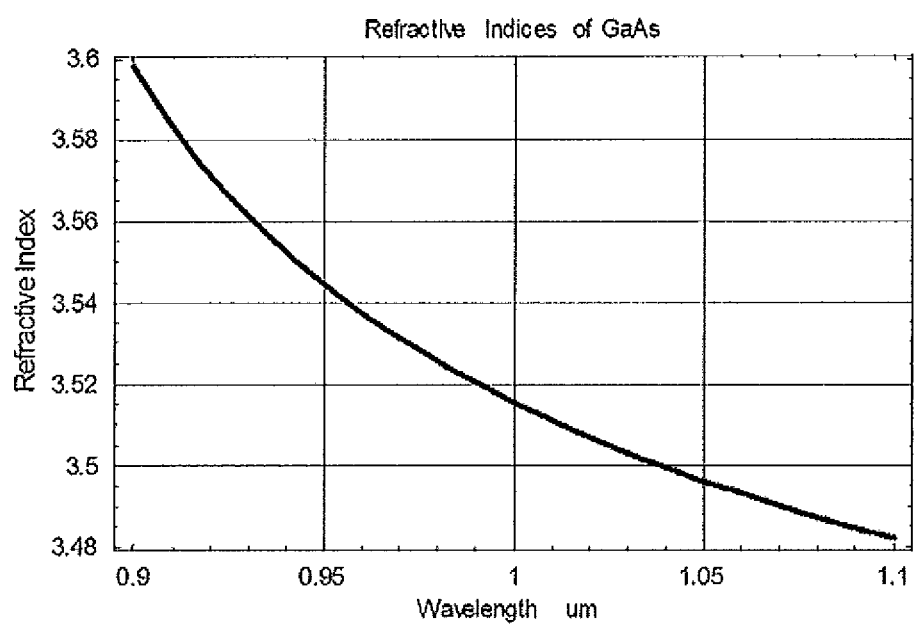
FIG. 3 shows the wavelength dependence of the refractive index of GaAs.

FIG. 3 shows the wavelength dependence of the refractive index of the bulk GaAs 1 µm wavelength range.

Generally, the refractive index of a semiconductor shows a strong wavelength dependence in accordance with becoming the short wavelength and approaching the band gap.

Figure 4:
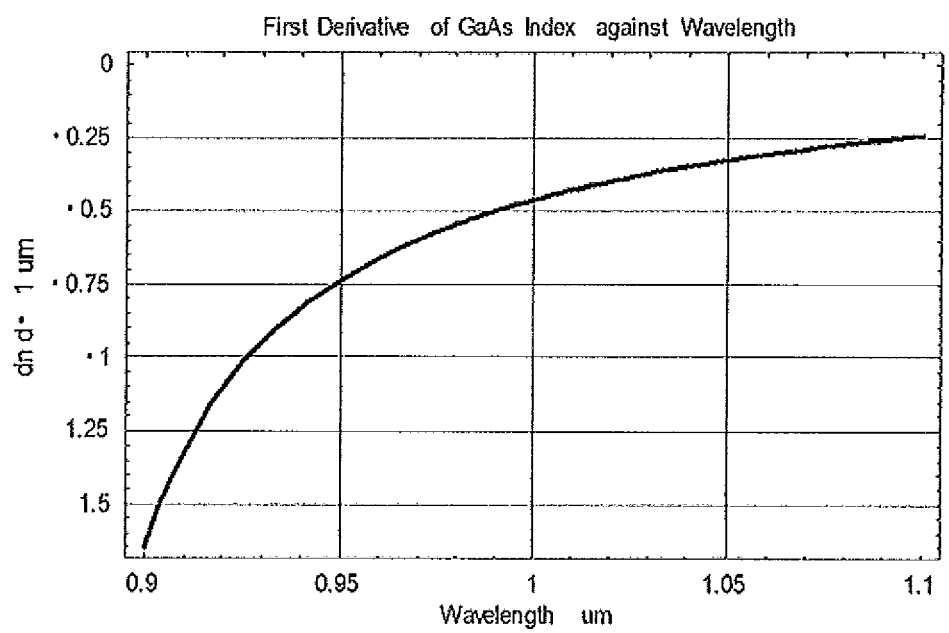
FIG. 4 shows the wavelength dependence of the differential of the refractive index.

FIG. 4 shows the calculation result in which the differential coefficient against the wavelength of refractive index was calculated by [1/µm] unit.

Figure 5:
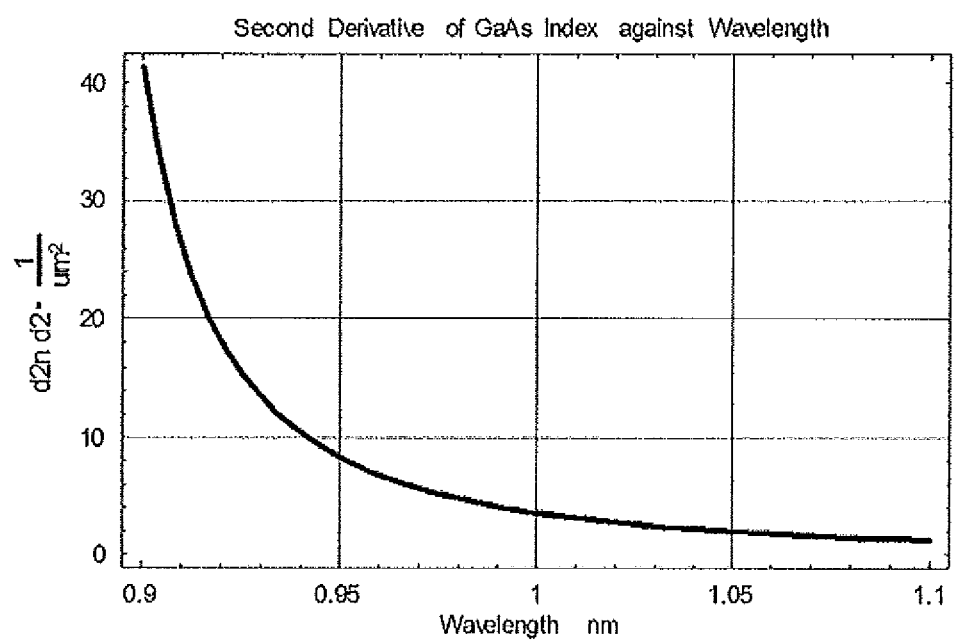
FIG. 5 shows the wavelength dependence of the quadratic differential of the refractive index.

Further, FIG. 5 shows the calculation result in which the quadratic differential coefficient against the wavelength of refractive index was calculated by [1/µm$^2$] unit.

From these figures, the primary differential coefficient and the quadratic differential coefficient for the wavelength of the refractive index in a specific wavelength can be read.

Incidentally, the refractive index of a collimation lens is defined by the following formula.

$$n_2(\lambda) = n_2(\lambda_0) + \frac{dn_2(\lambda)}{d\lambda}\bigg|_{\lambda_0} \Delta\lambda + \frac{1}{2}\frac{d^2 n_2(\lambda)}{d\lambda^2}\bigg|_{\lambda_0}(\Delta\lambda)^2 + \ldots \quad \text{formula 6}$$

Figure 6:
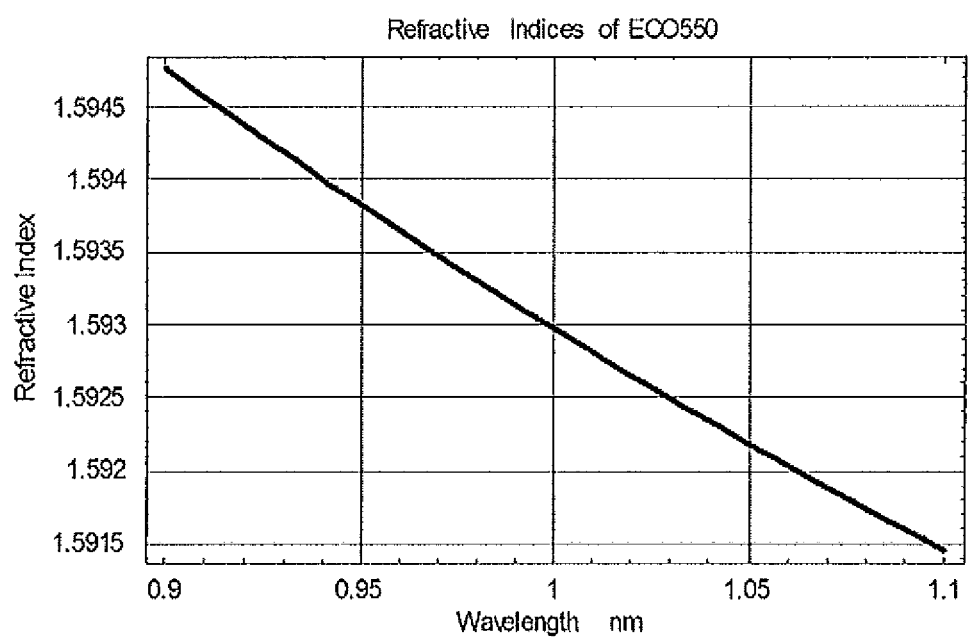
FIG. 6 shows the wavelength dependence of the refractive index of EC0550.

The data of the refractive index dispersion of collimation lens is provided from each maker. For example, FIG. 6 shows the wavelength dependence of the refractive index of a glass mold material ECO 550 which is used in an example of execution.

Figure 7:
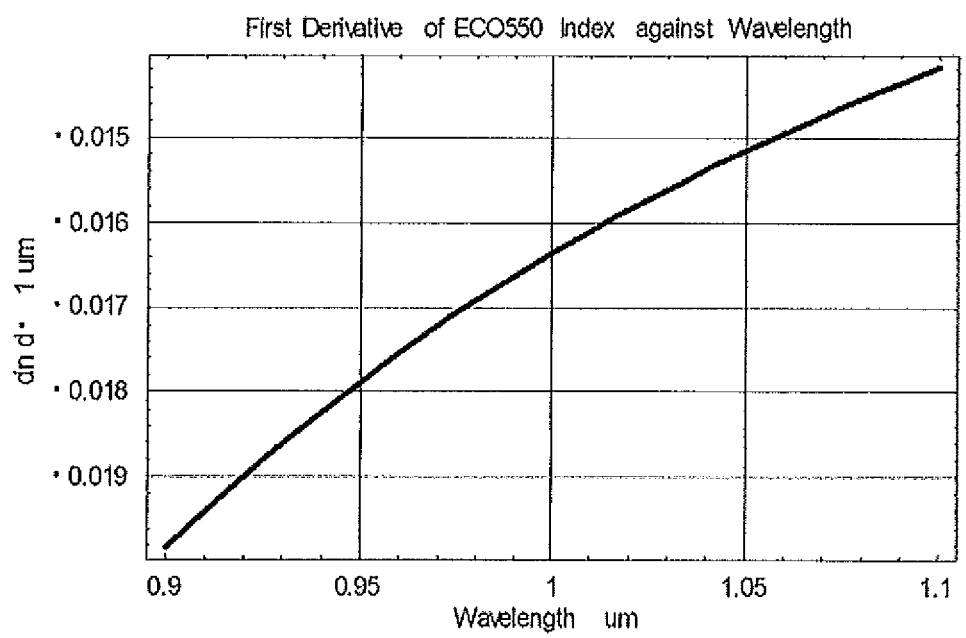
FIG. 7 shows the wavelength dependence of the differential of the refractive index of EC0550.
Figure 8:
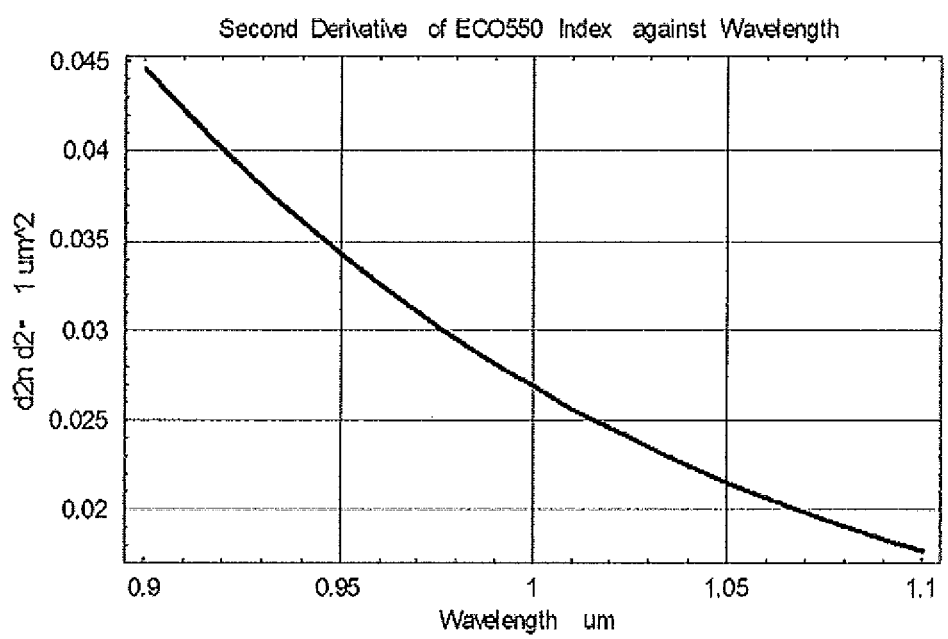
FIG. 8 shows the wavelength dependence of the quadratic differential of the refractive index of EC0550.

Further, FIG. 7 shows the primary differential coefficient against the wavelength and FIG. 8 shows the quadratic coefficient against the wavelength.

As these figures show, the refractive index dispersion of the laser chip is an order of magnitude greater than the refractive index dispersion of the glass mold, and it controls the refractive index dispersion of the resonator.

When l is the length of the laser diode chip and t is the effective thickness of the collimation lens, the optical length of the resonator which is shown in FIG. 2 is expressed in the following formula.

$$L_0(\sin\alpha + \sin\beta) + \quad \text{formula 7}$$
$$\left(n_1(\lambda_0) + \frac{dn_1(\lambda)}{d\lambda}\bigg|_{\lambda_0}\Delta\lambda + \frac{1}{2}\frac{d^2 n_1(\lambda)}{d\lambda^2}\bigg|_{\lambda_0}(\Delta\lambda)^2 - 1\right)l +$$
$$\left(n_2(\lambda_0) + \frac{dn_2(\lambda)}{d\lambda}\bigg|_{\lambda_0}\Delta\lambda + \frac{1}{2}\frac{d^2 n_2(\lambda)}{d\lambda^2}\bigg|_{\lambda_0}(\Delta\lambda)^2 - 1\right)t - \Delta$$

Then, the above formula can be simplified by focusing the exponential of $\Delta\lambda$ as in the below formula.

$$L_0(\sin\alpha + \sin\beta) + \frac{((n_1(\lambda_0)-1)l + (n_2(\lambda_0)-1)t - \Delta)}{\lambda_0}\lambda_0 + \quad \text{formula 8}$$
$$\left(\frac{dn_1(\lambda)}{d\lambda}\bigg|_{\lambda_0}l + \frac{dn_2(\lambda)}{d\lambda}\bigg|_{\lambda_0}t\right)\Delta\lambda +$$
$$\left(\frac{1}{2}\frac{d^2 n_1(\lambda)}{d\lambda^2}\bigg|_{\lambda_0}l + \frac{1}{2}\frac{d^2 n_2(\lambda)}{d\lambda^2}\bigg|_{\lambda_0}t\right)(\Delta\lambda)^2 + \ldots$$

Furthermore, if the below formula is established, the above formula $$\frac{((n_1(\lambda_0)-1)l + (n_2(\lambda_0)-1)t - \Delta)}{\lambda_0} = \quad \text{formula 9}$$
$$\left(\frac{dn_1(\lambda)}{d\lambda}\bigg|_{\lambda_0}l + \frac{dn_2(\lambda)}{d\lambda}\bigg|_{\lambda_0}t\right)$$

can be simplified as the below formula.

$$L_0\frac{\lambda}{d} + \left(\frac{dn_1(\lambda)}{d\lambda}\bigg|_{\lambda_0}l + \frac{dn_2(\lambda)}{d\lambda}\bigg|_{\lambda_0}t\right)(\lambda_0 + \Delta\lambda) + \quad \text{formula 10}$$
$$\left(\frac{1}{2}\frac{d^2 n_1(\lambda)}{d\lambda^2}\bigg|_{\lambda_0}l + \frac{1}{2}\frac{d^2 n_2(\lambda)}{d\lambda^2}\bigg|_{\lambda_0}t\right)(\Delta\lambda)^2 + \ldots$$

In the above formula, the first term and the second term are in proportion to the wavelength $\lambda$, respectively.

Namely, by adjusting the offset value of the end mirror as in the below formula, it is possible to cancel the effect in which the linear dispersion of the refractive index affects the mode-hop.

$$\Delta = n_1(\lambda_0) - 1)l + (n_2(\lambda_0) - 1)t - \quad \text{formula 11}$$
$$\lambda_0\left(\frac{dn_1(\lambda)}{d\lambda}\bigg|_{\lambda_0}l + \frac{dn_2(\lambda)}{d\lambda}\bigg|_{\lambda_0}t\right)$$

Even though the linear dispersion of the refractive index which is in proportion to $\Delta\lambda$ is corrected by adjusting the resonator length $\Delta$, the group velocity dispersion term which is in proportion to the square of $\Delta\lambda$ cannot be corrected.

If the value is larger than $\lambda/2$, mode-hop will occur. Therefore, the mode-hop-free band width $B_{MHF}$ is limited, as the following formula indicates.

$$B_{MHF} \leq 2\sqrt{\lambda \bigg/ \left(\frac{d^2 n_1(\lambda)}{d\lambda^2}\bigg|_{\lambda_0}l + \frac{d^2 n_2(\lambda)}{d\lambda^2}\bigg|_{\lambda_0}t\right)} \quad \text{formula 12}$$

Namely, for example, using the value of the example of execution, l=2100 µm, t=3500 µm are used, and calculating the mode-hop-free bandwidth against $\lambda$=1 µm, the value become about 20 nm.

The bandwidth gets smaller by a decrease in the $\lambda$ term and an increase in the group velocity dispersion, as the bandwidth becomes short.

Further, in a high power output and broadband tunable resonator laser which requires long chip length, it is getting more difficult to obtain the wide mode-hop-free tuning for Littman-type arrangement.

Practically, unlike the optical communication band, in the region of 1 µm or shorter, there is no product which has the mode-hop-free region greater than several tens nanometer.

In order to realize a broadband mode-hop-free tuning in the short wavelength region which the group velocity dispersion of the laser chip is large, or in a high power output and broadband wavelength tuning laser which requires a long laser chip, the modified Littman-type resonator arrangement is proposed to the tunable external resonator laser of this embodiment. The arrangement of the laser is shown in FIG. 9.

Figure 9:
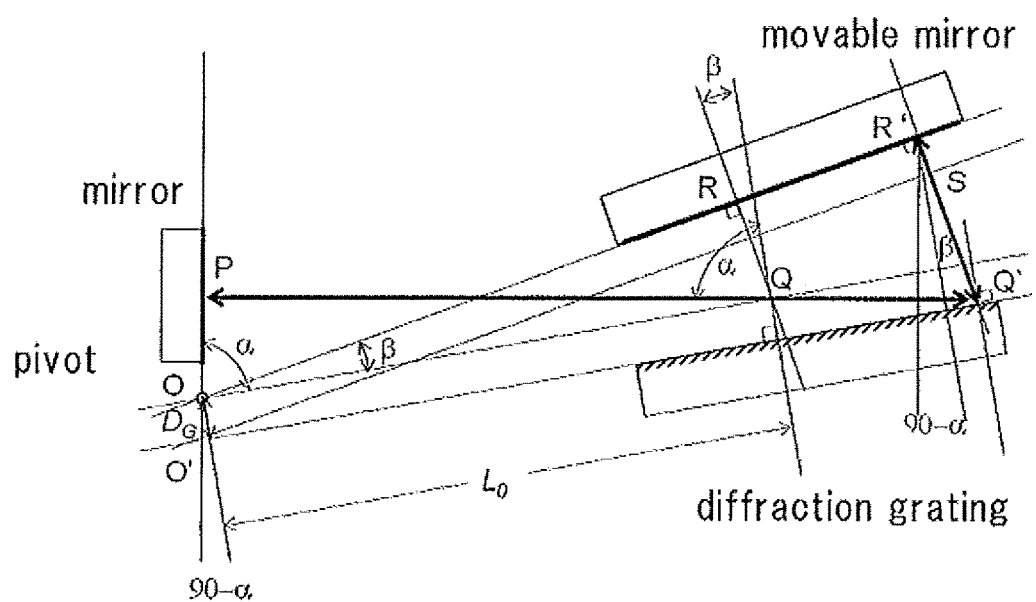
FIG. 9 shows a structure of a modified Littman-type resonator.

As shown in FIG. 9, in a Littman-type resonator arrangement in which one line is shared and the angle of each other is expressed as α or β, if the distance between the beam and the pivot OP, the spacing of grooves d, and the degree of the used diffraction are decided, the resonance wavelength and the resonator length will be decided.

Now, we investigate the modified Littman-type arrangement in which the resonator length changes so as to suppress the mode-hop by the group velocity dispersion of the laser chip, when the resonator length is tuned by changing the angle β which is between the diffracting grating and the movable mirror.

In this resonator arrangement, the parameter for modification is only the parallel movements of the mirror, the movable mirror or the diffraction grating.

However, the parallel movements of the mirror and the movable mirror just give offsets of a specified value, and they do not change the β dependence of the resonator length.

Practically, the arrangement in which the mirror and the movable mirror were moved in the forward and backward directions so that the resonator length did not change, satisfies the mode-hop-free tuning condition of the above-described Littman-type arrangement.

If standing on this assumption, in a Littman-type tunable external resonator laser, it is found that the parameter which effects the mode-hop-free tuning is only the distance between the rotation axis of the movable mirror and the diffraction grating surface.

Hereafter, we will investigate the parameters of a modified Littman-type tunable external resonator laser.

By solving the geometrical problem, the resonator length L in a modified Littman-type arrangement is defined in the following formula.

$$L = \frac{L_0 \cos\alpha + D_G/\cos(90-\alpha)}{\cos\alpha}(\sin\beta + \sin\alpha) + \left(\frac{D_G}{\cos(90-\alpha)}\right)\cos(90-\alpha+\beta) \quad \text{formula 13}$$

The following formula is obtained by the above formula when the angle β is expressed by resonance wavelength λ.

$$\frac{L_0 \cos\alpha + D_G/\cos(90-\alpha)}{\cos\alpha}\frac{\lambda}{d} - D_G\frac{\cos\alpha}{\sin\alpha}\frac{\lambda}{d} + D_G\sqrt{1-\left(\frac{\lambda}{d}-\sin\alpha\right)^2} + D_G\cos\alpha \quad \text{formula 14}$$

In the above formula, the first term and the second term are in proportion to the resonance wavelength λ, respectively.

The fourth term is a constant value.

The following formula is obtained after performing a Taylor expansion to the third term around λ0 and adopting the secondary term or earlier terms.

$$\frac{L_0 \cos\alpha + D_G/\cos(90-\alpha)}{\cos\alpha}\frac{\lambda}{d} - D_G\frac{\cos\alpha}{\sin\alpha}\frac{\lambda}{d} + D_G\sqrt{1-\left(\frac{\lambda_0}{d}-\sin\alpha\right)^2} - \frac{D_G}{d}\frac{\left(\frac{\lambda}{d}-\sin\alpha\right)}{\sqrt{1-\left(\frac{\lambda}{d}-\sin\alpha\right)^2}}\Bigg|_{\lambda_0} \quad \text{formula 15}$$

$$\Delta\lambda - \frac{D_G}{d^2}\frac{1}{\left(\sqrt{1-\left(\frac{\lambda}{d}-\sin\alpha\right)^2}\right)^{3/2}}\Bigg|_{\lambda_0}(\Delta\lambda)^2 + D_G\cos\alpha$$

Figure 10:
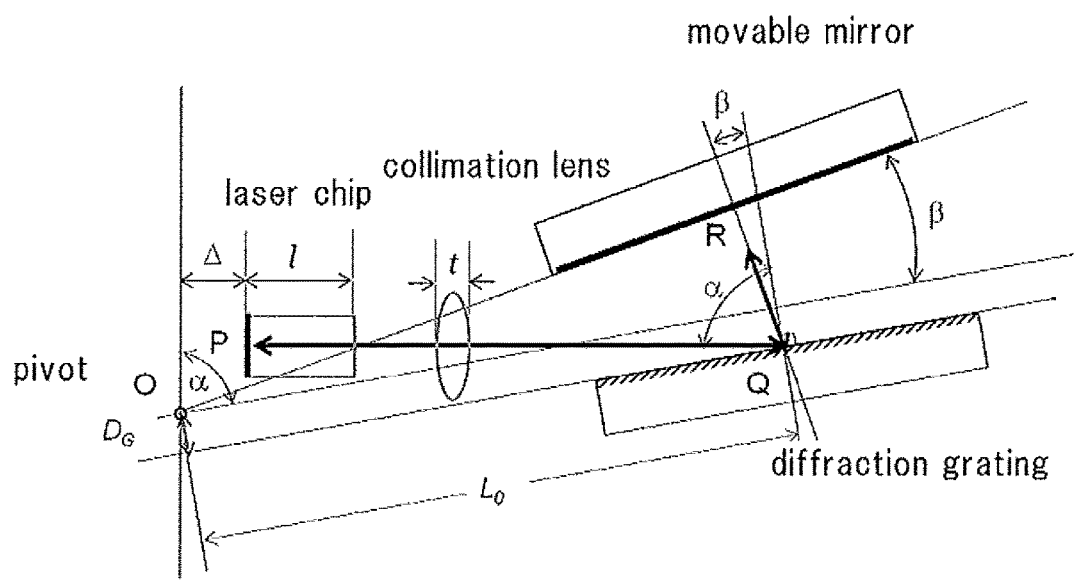
FIG. 10 shows a structure of a modified Littman-type resonator using a laser diode.

Therefore, in a Littman-type tunable external resonator laser arrangement using the laser diode chip and the collimation lens as indicated in FIG. 10, if the offset $D_G$ of the diffraction grating against the pivot and the offset Δ of the rear end surface mirror of the laser chip are adjusted, correction of the group velocity dispersion of the laser diode chip will be possible, and the tunable laser with the mode-hop-free tuning for broadband can be achieved.

Naturally, as mentioned above, the offset Δ of the rear end surface mirror of the laser chip is able to be distributed to the offset of the movable mirror.

Specifically, the offset value of the grating surface from the pivot, which is for correcting the group velocity dispersion is expressed as the below formula.

$$D_G = \left(\frac{d^2 n_1(\lambda)}{d\lambda^2}\Bigg|_{\lambda_0} l + \frac{d^2 n_2(\lambda)}{d\lambda^2}\Bigg|_{\lambda_0} t\right)\left(\sqrt{1-\left(\frac{\lambda_0}{d}-\sin\alpha\right)^2}\right)^3 d^2 \quad \text{formula 16}$$

Furthermore, the offset value of the resonance wavelength λ for correcting the term which is in proportion to Δλ is expressed as the below formula.

$$\Delta = D_G\cos\alpha + ((n_1(\lambda_0)-1)l + (n_2(\lambda_0)-1)t) + \quad \text{formula 17}$$
$$D_G\sqrt{1-\left(\frac{\lambda_0}{d}-\sin\alpha\right)^2} - \lambda_0\Bigg\{\frac{D_G}{d}\frac{\left(\frac{\lambda}{d}-\sin\alpha\right)}{\sqrt{1-\left(\frac{\lambda}{d}-\sin\alpha\right)^2}}\Bigg|_{\lambda_0}$$
$$+ \left(\frac{dn_1(\lambda)}{d\lambda}\Bigg|_{\lambda_0} l + \frac{dn_2(\lambda)}{d\lambda}\Bigg|_{\lambda_0} t\right)\Bigg\}$$

Generally, since the value of the group velocity dispersion of the waveguide mode of the laser diode and the value of the group velocity dispersion of the lens material is positive, the value of DG is positive.

Namely, by translating the diffraction grating in a direction which is far from the opposite mirror, it is possible to suppress the mode-hop of the group velocity dispersion.

As it is evident from the comparison between FIG. 5 and FIG. 8, the group velocity dispersion of the effective refractive index of the laser diode is two digits greater than the group velocity dispersion of the optical material. So, we have only to consider the group velocity dispersion of the laser diode, substantially.

The tunable external resonator laser described in the above non-patent document 4 can be used as a basis for the tunable external resonator laser of the present embodiment.

The structure of the tunable external resonator laser described in the above non-patent document 4 is the structure in which is transposed the normal Littman-type tunable external resonator laser. Then, it is possible to obtain a high spectral purity by removing the natural emission light from the half mirror.

However, the mechanism itself for achieving the mode-hop-free tuning can use a mechanism which is the same as a conventional Littman-type laser.

Figure 11:
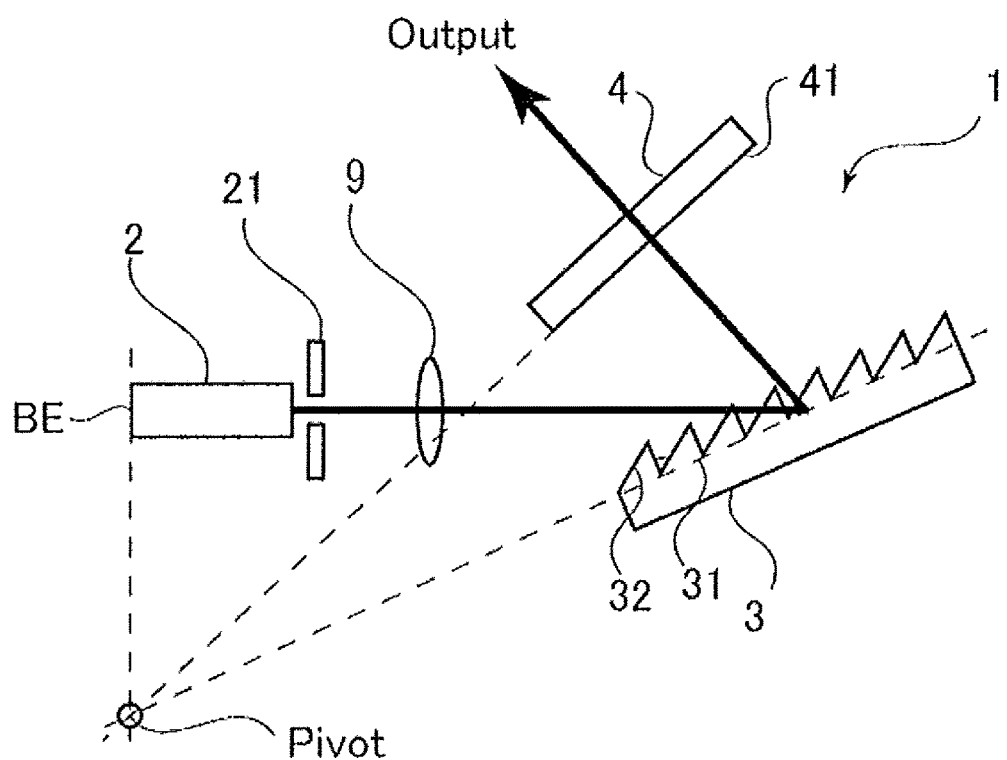
FIG. 11 shows an optical system of a tunable external resonator laser of the embodiment.

FIG. 11 shows a schematic of the optical system of the tunable external resonator laser 1 of this embodiment.

The tunable external resonator laser 1 of this embodiment has a laser chip 2 which emits light, a diffraction grating 3 which diffracts the light which is emitted from the laser chip 2, and a half mirror 4 which reflects part of the incident light and transmits another part of said incident light.

In this embodiment, a collimation lens 9 which collimates the light emitted from the laser chip 2 is arranged between the laser chip 2 and the diffraction grating 3.

Further, the tunable external resonator laser of this embodiment is composed of a laser chip, a diffraction grating and a half mirror. The arrangement of the tunable external resonator laser is a Littman-type.

Figure 12:
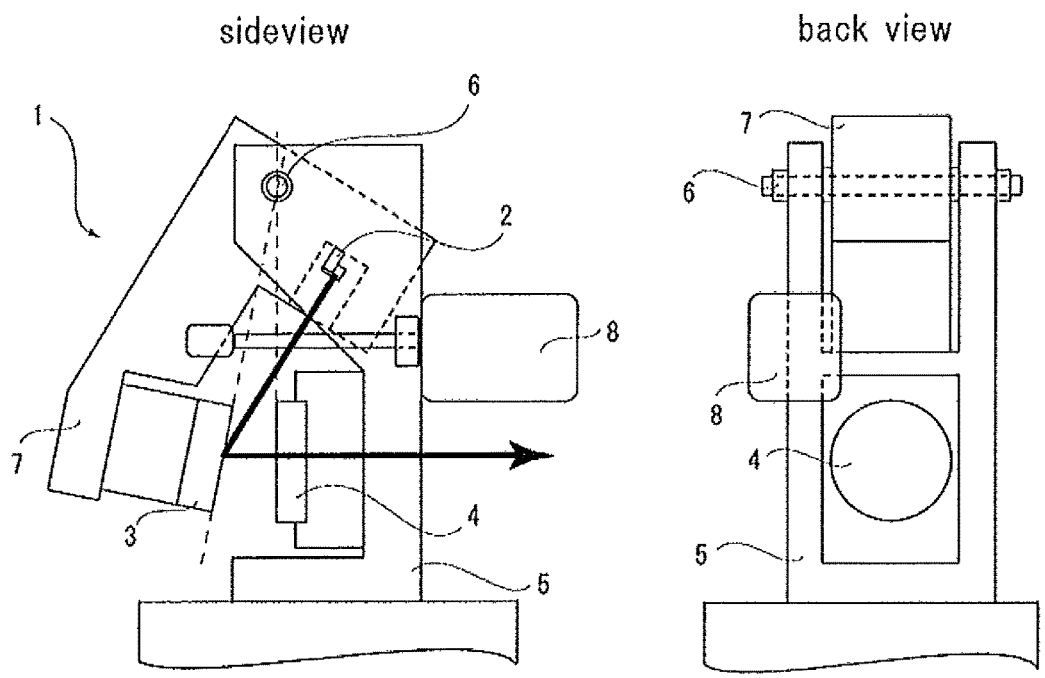
FIG. 12 shows a structure of a tunable external resonator laser of the embodiment.

FIG. 12 shows a schematic of the tunable external resonator laser 1 of this embodiment.

As shown in the above-description and this figure, in the tunable external resonator laser 1, the half mirror 4 is fixed to the fixed support body 5.

Further, the laser chip 2, collimation lens 9 and diffraction grating 3 is fixed to the rotatory support body 7.

The rotatory support body 7 is supported by the fixed support body 5 via the pivot 6 and it can rotate around the pivot 6 by driver 8.

Figure 13:
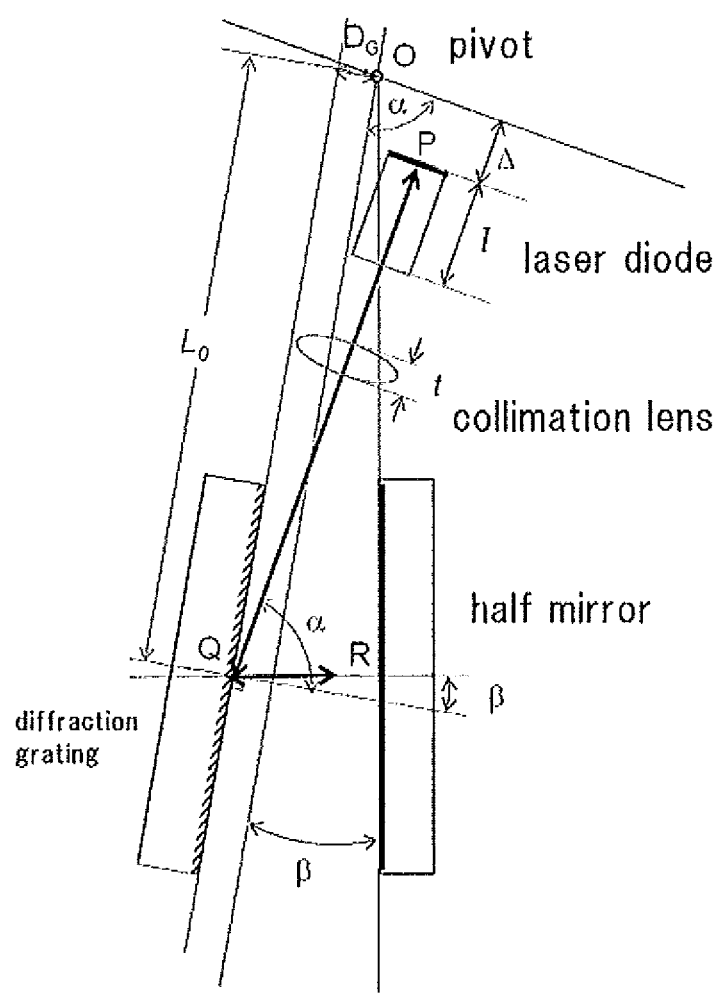
FIG. 13 shows an optical system of a modified Littman-type tunable external resonator laser of the example of execution.

FIG. 13 shows an optical arrangement of a modified Littman-type of this embodiment.

In this optical arrangement, the movable mirror of the conventional laser is fixed as a half mirror, and the support body which the laser diode and the collimation lens and the diffraction grating are fixed can be rotated around the pivot.

Even the geometrical relation of this arrangement is the same as that of FIG. 10.

In this structure, the laser diode is the same as the laser diode which is described in the above Non-Patent Document 4.

The laser diode was developed by OPTOENERGY Inc. and has a curved waveguide structure and a gain center of 1040 nm.

One end surface of which the light is emitted perpendicularly to the surface is covered with a high reflectance coating whose reflectance is 90% or higher, the other end surface is covered with a low reflectance coating whose reflectance is 2% or lower.

The waveguide inclined end surface was inclined 4 degree from perpendicularity. Since the reflected light on the end surface gets scattered and lost, the mode reflectance is quite low. So, it is suitable for a tunable external resonator laser.

A laser chip having a curved waveguide can be used as the chip which is described in the above Non-Patent Document 3, however, the chip is not restricted thereto.

The epitaxial structure of the laser diode used the structure which was described in the above Non-Patent Document 5.

The waveguide of the laser chip was composed of GaAs. The effective refractive index of the waveguide mode can be approximated by the reflective index which is shown in FIG. 3.

The length of the laser chip was 2.1 mm. The used collimation lens was an aspheric lens, C240TME-1064, which is sold by Thorlabs Inc.

The lens was an aspheric lens, the aperture of the lens was 0.5, and the focal length of the lens was 8 mm. Further, the lens was covered with a non-reflectance coating with a center wavelength of 1064 nm.

Furthermore, the lens was made of a glass mold of ECO-550. The refractive index of the lens is shown in FIG. 6.

Incidentally, the thickness of the center of the lens was 3.69 mm.

Furthermore, in this structure, the number of grooves of the diffraction grating was 1200 per 1 mm. The diffraction grating was model 10RG1200-1000-2 of Newport.

Further, the reflectance at 1040 nm of the half mirror is 30%. The transmitted light was extracted as the laser output.

Further, one surface of the half mirror has wedges of about 30 seconds, the other surface of the half mirror is covered with the non-reflecting coating. The reflected light which reflected on the other side was adjusted not to feed back to the laser diode.

The diffraction grating could be adjusted in rotation with the fixing of the center of the light practically. Accordingly, an experiment was carried out by changing the value $D_G$.

Further, the unit which unified the laser diode and the collimation lens could be moved in the forward and the backward directions, along with the optical axis.

Furthermore, the half mirror could be moved in the forward and the backward directions, too.

Accordingly, the offset of the resonator length was adjusted to not occur the mode-hop.

Furthermore, in this structure, the distance from the pivot to the center of the beam on the diffraction grating surface is 42 mm, the angle α is about 80 degrees, the angle β can be changed ±4 degrees from 14 degrees. Consequently, wavelength tuning can be achieved for a wavelength tunable region of about 100 nm.

Next, the simulation result which is executed in advance using the above parameters will be explained.

In the simulation, the dispersion including the high order terms of the laser diode chip was taken into consideration in the numeric calculation.

In the simulation, the dispersion of the laser diode chip was incorporated by the numerical calculation, including higher-order.

Furthermore, the group velocity dispersion of the collimation lens was ignored because it is smaller than the group velocity dispersion of the chip by two orders of magnitude.

Figure 14:
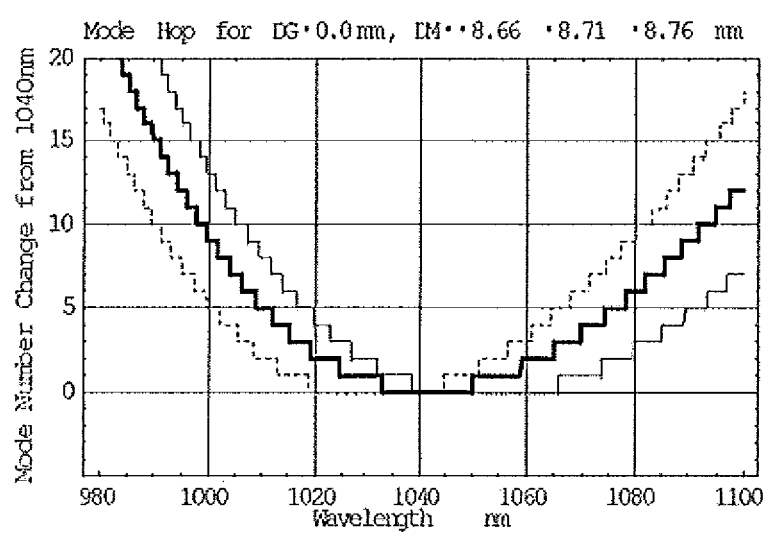
FIG. 14 shows a mode-hop under the condition of Dc=0 mm and $D_M$=−8.66/−8.71/−8.76 mm.

FIG. 14 shows the mode-hop in wavelength sweeping in the case of a grating offset DG=0, i.e. a normal Littman-type arrangement.

The vertical axis indicates the change of the number of vertical mode from the center wavelength of 1040 nm.

The thick solid line means the calculation result for minimizing the mode-hop, which the linear dispersion and the refractive index of the center wavelength of the laser chip or the lens were corrected.

The resonator length is shorter by 8.71 mm than the resonator length of an empty Littman-type resonator, and the offset of the resonator length of the mirror $D_M$ is −8.71 mm.

In this case, the correction of the effective refractive index of the center wavelength of the laser diode is 5.20 mm, the correction of the linear dispersion of the refractive index is 0.75 mm, the correction of the refractive index of the center wavelength of the collimation lens is 2.18 mm, and the correction of the linear dispersion of the index refraction.

For reference, in the figure, the thin solid line means the result when the offset of the resonator length $D_M$ was increased by 0.05 mm from an optimized value of 8.71. Further, in the figure, the thin dotted line means the result when the offset of the resonator length $D_M$ was decreased by 0.05 mm from an optimized value of 8.71.

The calculation is for the investigation of the frequency against the wavelength sweeping of mode jump, not for the investigation of the place where the individual mode jump occurs.

It is found that the mode-hop-free tuning wavelength is 20-30 mm at most, though the resonator length is controlled so that the mode jump being generated is in the reverse direction.

The value does not depend on the length of the tunable external resonator laser. The value is in proportion to the square root of the product of the group velocity dispersion of the effective refractive index of the laser diode and the chip length.

Figure 15:
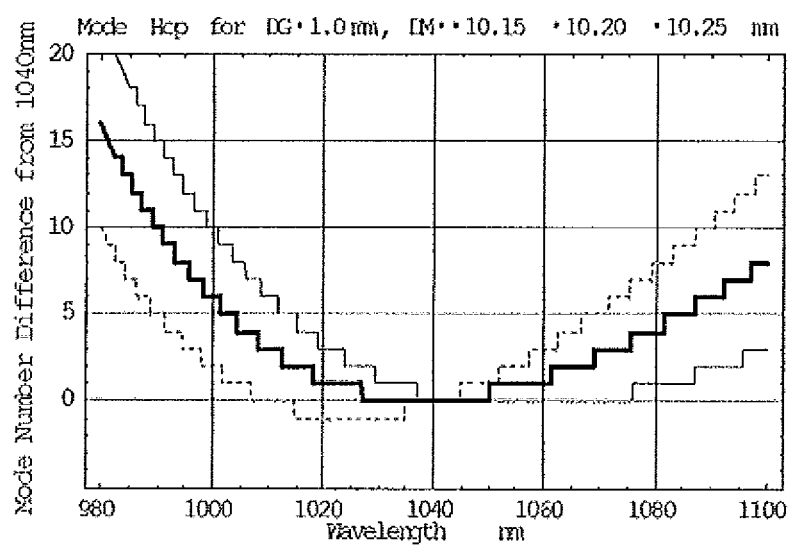
FIG. 15 shows a mode-hop under the condition of Dc=1.0 mm and $D_M$=−10.15/−10.20/−10.25 mm.
Figure 16:
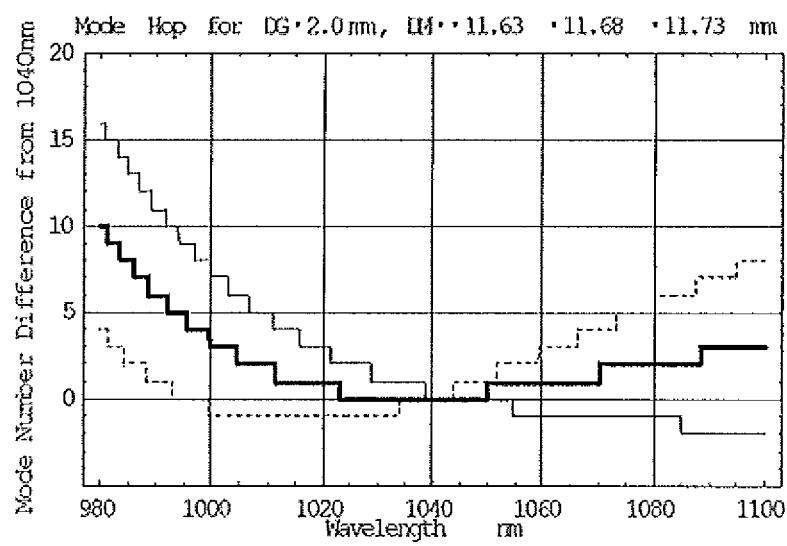
FIG. 16 shows a mode-hop under the condition of Dc=2.0 mm and $D_M$=−11.63/−11.68/−1.73 mm.
Figure 17:
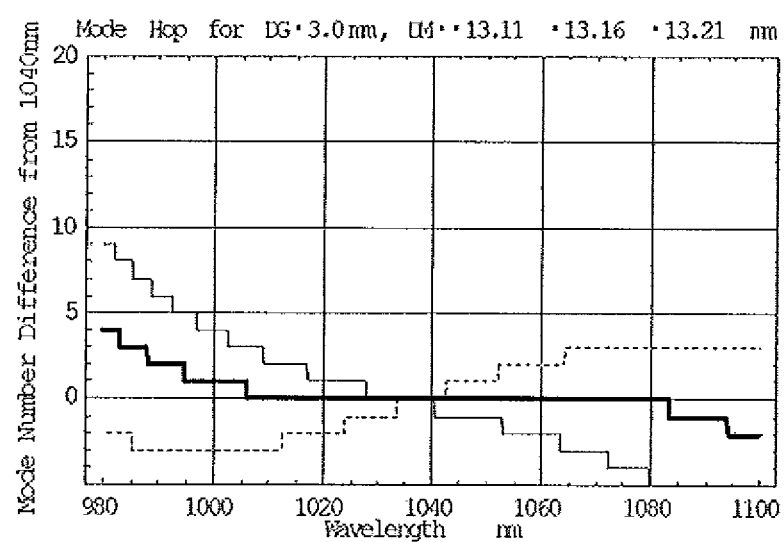
FIG. 17 shows a mode-hop under the condition of Dc=3.0 mm and $D_M$=−13.11/−13.16/−13.21 mm.

FIGS. 15, 16 and 17 show the simulation results in cases of grating offsets of $D_G$=1.0 mm, $D_G$=2.0 mm or $D_G$=3.0 mm, respectively.

The mirror offsets which correspond to the optimum conditions are $D_M$=10.20 mm, $D_M$=11.68 mm, $D_M$=13.16 mm, respectively.

The reason that the optimum $D_M$ is changed together with a change of $D_G$ is that it is necessary to correct the change of the resonator length.

Since it is necessary to correct the change of the resonator length caused by introducing the $D_M$ and correct the change of the resonator length which is proportional to the difference between the center wavelength and the resonance wavelength, the optimum $D_M$ changes together with the change of $D_G$.

FIG. 15, FIG. 16 and FIG. 17 show the simulation result. In this case, the offset is dislocated forward or backward by 0.05 mm from the optimized resonator length, as FIG. 14 shows.

From these figures, it is found that, associated with the increase of $D_M$, the increase of the effective resonator length which comes from the group velocity dispersion of the chip is corrected, and the mode-hop is suppressed.

Further, in the arrangement in which the grating surface is disposed apart from the mirror so that the distance between the grating surface and the pivot is 3.0 mm, the mode-hop is notably suppressed. Then, it is found that a mode-hop-free tuning region can be obtained.

It is thought that the remaining mode-hop is dependent on the third term of the refractive index dispersion, and the second term will be completely corrected when the diffraction grating surface is properly offset.

The mode-hop of oscillation frequency was investigated by investigating the etalon transmission signal of 10 GHz of output light in a wavelength sweeping of the tunable external resonator laser.

The etalon transmissivity of the narrow line width laser which oscillates a single frequency vibrates every 10 GHz, periodically.

Since, the mode-hop occurs at 2.5 GHz, which is the mode spacing of the tunable external resonator laser, it is possible to monitor the occurrence of the mode-hop by measuring the periodical turbulence of the etalon transmissivity. Further it is possible to decide the fluctuation of the number of the mode based on the direction of the phase shift associated with the mode-hop.

Figure 18:
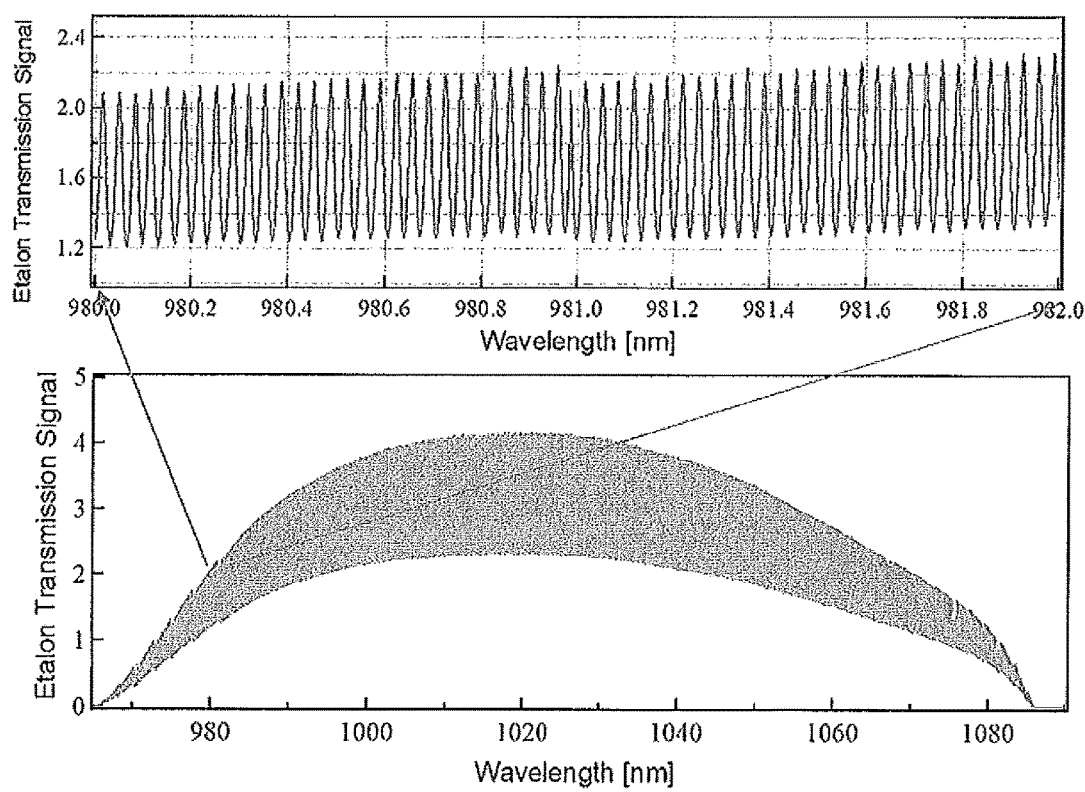
FIG. 18 shows an etalon transmission signal of an output of a Littman-type tunable external resonator laser.

FIG. 18 shows the wavelength dependence of the etalon transmission signal of a normal Littman-type tunable external resonator laser. The condition of the resonance wavelength is optimized for minimizing the mode-hop.

In the upper part of FIG. 18, a zoomed etalon transmission signal from 980 nm to 982 nm is shown.

In the zoomed etalon transmission signal, the disturbance of the period was observed near 981 nm. By this observation, the occurrence of mode-hop was confirmed.

Furthermore, by the phase relation, it can be confirmed that the number of longitudinal modes decreases when the wavelength increases.

Figure 19:
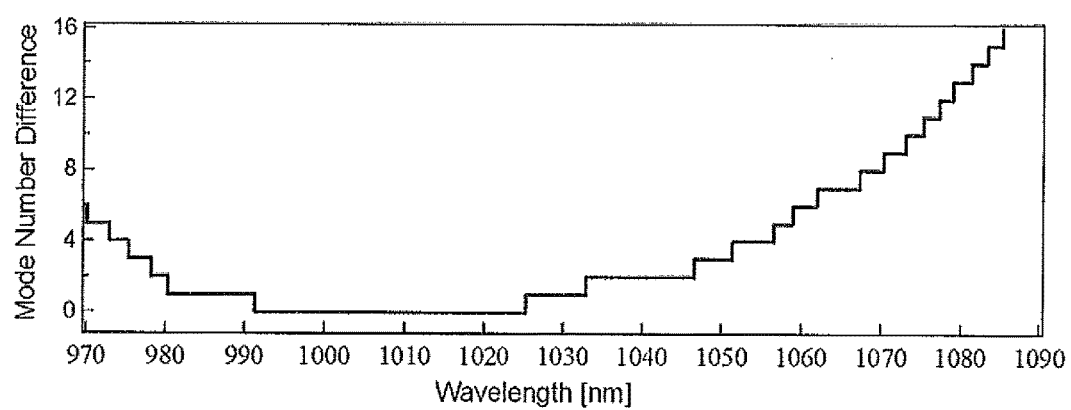
FIG. 19 shows a mode-hop of a Littman-type tunable external resonator laser.

FIG. 19 shows a change of the wavelength mode-hop occurred and the number of the mode in a Littman-type tunable external resonator laser.

The change of the number of the mode is indicated around 1010 nm which is a turning point.

Comparing with the simulation result of FIG. 14, although the optimized wavelength of the experiment was slightly shifted to the short wavelength side, the group velocity dispersion of the laser diode dominated the mode-hop of the Littman-type tunable external resonator laser.

Therefore, it is found that the obtainable mode-hop-free region is limited to about 30 nm at most.

Figure 20:
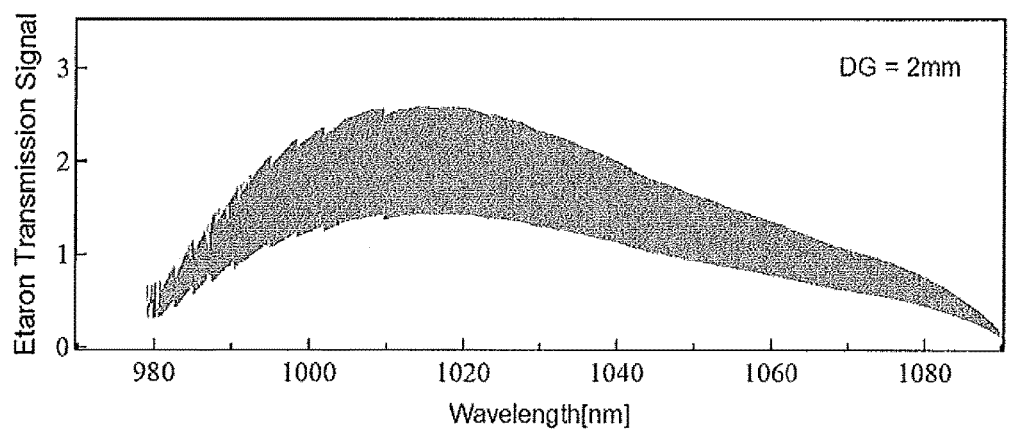
FIG. 20 shows an etalon transmission signal of an output of a tunable external resonator laser of an example of execution.

Like the simulation result, FIG. 20 shows the wavelength dependence of the etalon transmission signal of the example of execution. The resonance wavelength is optimized by setting the offset $D_G$=2 mm.

Figure 21:
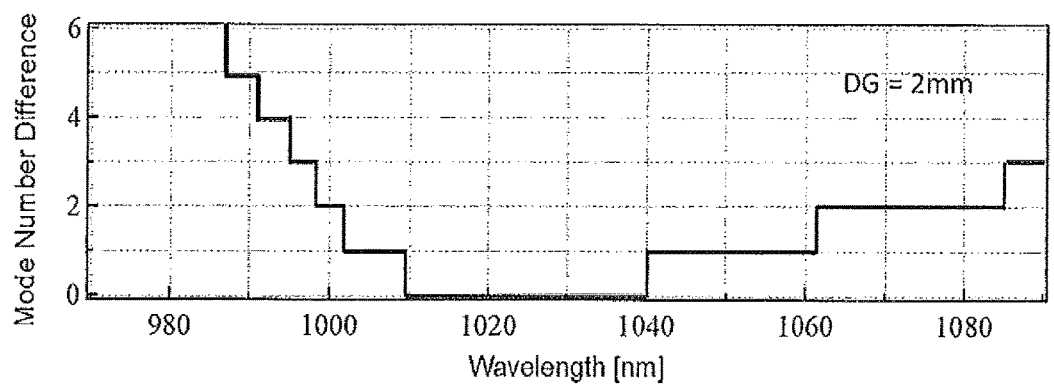
FIG. 21 shows a mode-hop of a tunable external resonator laser of an example of execution.

Further, FIG. 21 shows the result of monitoring the mode-hop from an etalon transmission signal of 10 GHz.

Figure 22:
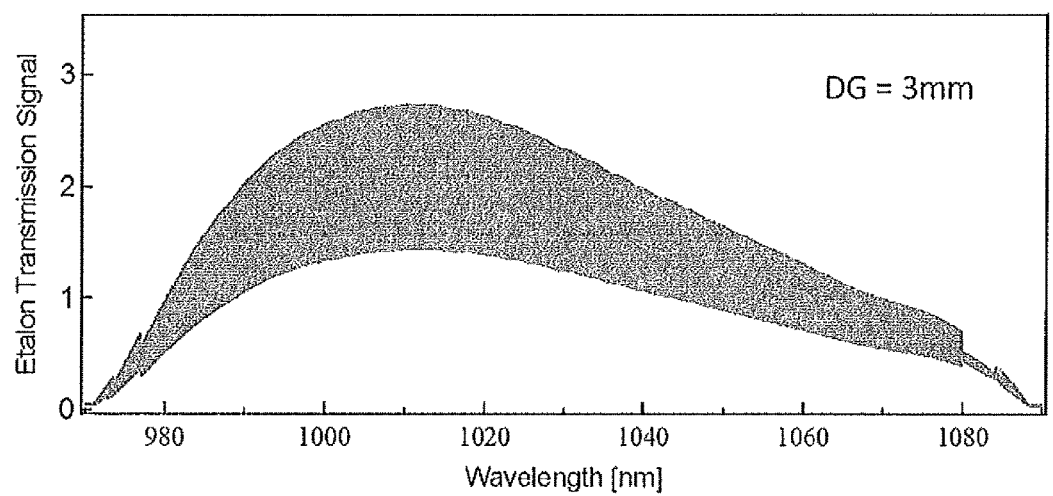
FIG. 22 shows an etalon transmission signal of an output of a tunable external resonator laser of an example of execution.

Furthermore, FIG. 22 shows the wavelength dependence of the etalon transmission signal of the example of execution. The resonance wavelength is optimized by setting the offset $D_G$=3 mm.

Figure 23:
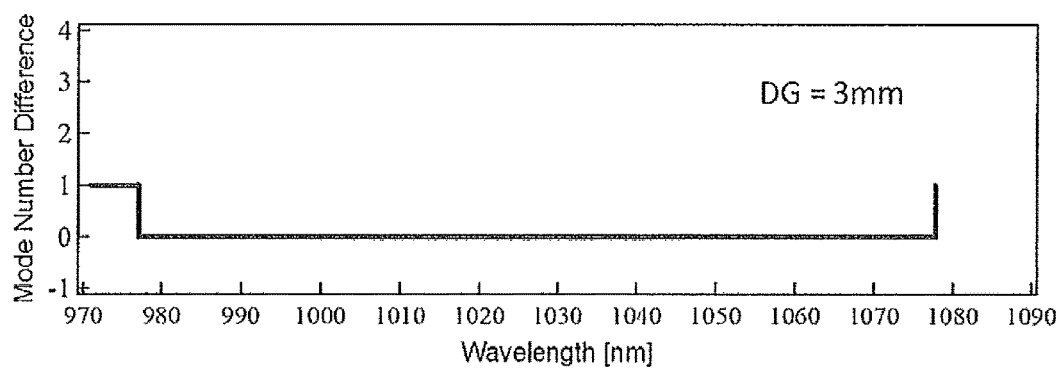
FIG. 23 shows a mode-hop of a tunable external resonator laser of an example of execution.

Furthermore, FIG. 23 shows the result of monitoring the mode-hop from an etalon transmission signal of 10 GHz.

Like the result obtained from the simulation result, in the condition of DG=3 mm, mode-hop-free tuning for a 100 nm range was achieved.

Mode-hop-free tuning for a wide wavelength range can be achieved by the present invention though in the short wavelength range which mode-hop-free tuning is difficult. Further it can also be achieved even a high power tunable external resonator laser using laser diode chip.

INDUSTRIAL APPLICABILITY

The present invention may be utilized in high-resolution spectroscopy which requires broadband mode-hop-free tuning for broadband. Furthermore, the present invention may also be utilized in advanced measurement, medical treatment measurement, environmental measurement and industrial measurement which require high precision spectroscopy with low noise.

DESCRIPTION OF NUMERALS

1: A tunable external resonator laser
2: laser chip
3: diffraction grating
4: half mirror
5: fixed support body
6: shaft
7: rotatory support body

The invention claimed is:
1. A tunable external resonator laser which suppresses mode hop, said laser comprising:
a laser chip for emitting light;
a lens for collimating the light emitted from the laser;
a diffraction grating for diffracting the light collimated by the lens;
a support body to which the diffraction grating is fixed, and a movable mirror for reflecting the light diffracted by the diffraction grating, the movable mirror being rotatable about a pivot located on an intersection line of planes containing surfaces of the movable mirror and a first plane which is parallel to the diffraction grating surface and is movable from the first plane to a second plane parallel to the first plane, wherein an offset $D_G$ of the diffraction grating surface and said pivot is determined by the following formula $$D_G = \left( \frac{d^2 n_1(\lambda)}{d\lambda^2} \bigg|_{\lambda_0} l + \frac{d^2 n_2(\lambda)}{d\lambda^2} \bigg|_{\lambda_0} t \right) \left( \sqrt{1 - \left( \frac{\lambda_0}{d} - \sin\alpha \right)^2} \right)^3 d^2$$

wherein $\lambda_0$ is a desired center wavelength, $n_1(\lambda)$ is an effective refractive index of a waveguide mode of the laser chip, $n_2(\lambda)$ is a refractive index of the collimation lens, $d^2 n_1(\lambda)/d\lambda^2$ or $d^2 n_2(\lambda)/d\lambda^2$ is respectively quadratic differential coefficient for each wavelength of refractive index, l is the chip length of the laser chip, t is the effective thickness of the collimation lens, d is an interval of grooves of the diffraction grating, $\alpha$ is an incident angle between collimated light and the diffraction grating, with the collimating light being incident.

2. A tunable external resonator laser which suppresses mode hop, said laser comprising:
a laser chip for emitting light;
a lens for collimating the light emitted from the laser chip;
a diffraction grating for diffracting the light collimated by the lens, the diffraction grating being positioned at a second position which is offset from a previous position such that a plane containing a diffracting surface thereof is parallel to a plane containing the diffracting surface at the previous position;
a support body to which the diffraction grating is fixed, and
a movable mirror for reflecting the light diffracted by the diffraction,
wherein the movable mirror rotates on a pivot which is located on an intersection line of planes containing surfaces of the movable mirror and a first plane which is parallel to the diffraction grating surface, and an offset $D_G$ of the diffraction grating surface and said pivot is determined by the following formula $$D_G = \left( \frac{d^2 n_1(\lambda)}{d\lambda^2} \bigg|_{\lambda_0} l + \frac{d^2 n_2(\lambda)}{d\lambda^2} \bigg|_{\lambda_0} t \right) \left( \sqrt{1 - \left( \frac{\lambda_0}{d} - \sin\alpha \right)^2} \right)^3 d^2,$$

wherein $\lambda_0$ is a desired center wavelength, $n_1(\lambda)$ is the effective refractive index of a waveguide mode of the laser chip, $n_2(\lambda)$ is the refractive index of the collimation lens, $d^2 n_1(\lambda)/d\lambda^2$ or $d^2 n_2(\lambda)/d\lambda^2$ is respectively a quadratic differential coefficient for each wavelength of refractive index, l is the chip length of the laser chip, t is the effective thickness of the collimation lens, d is the interval of grooves of the diffraction grating, and $\alpha$ is the incident angle between collimated light and the diffraction grating, with the collimating light being incident.

3. A tunable external resonator laser for suppressing mode hop, said laser comprising:
a laser chip for emitting light;
a lens for collimating the light emitted from the laser;

a support body to which a diffraction grating is fixed, said support body being rotatable about a pivot which is contained in a plane containing surfaces of the half mirror and a first plane which is parallel to the diffraction grating surface and movable from a first plane to a second plane parallel to the first plane, and
a half mirror for reflecting part of the light incident thereon and transmitting another part of the incident light,
wherein the movable mirror rotates on a pivot which is located on an intersection line of planes containing a surface of the movable mirror and the first plane, and an offset $D_G$ of the diffraction grating surface and said pivot is determined by the following formula $$D_G = \left( \frac{d^2 n_1(\lambda)}{d\lambda^2} \bigg|_{\lambda_0} l + \frac{d^2 n_2(\lambda)}{d\lambda^2} \bigg|_{\lambda_0} t \right) \left( \sqrt{1 - \left( \frac{\lambda_0}{d} - \sin\alpha \right)^2} \right)^3 d^2$$

wherein $\lambda_0$ is a desired center wavelength, $n_1(\lambda)$ is the effective refractive index of a waveguide mode of the laser chip, $n_2(\lambda)$ is the refractive index of the collimation lens, $d^2 n_1(\lambda)/d\lambda^2$ or $d^2 n_2(\lambda)/d\lambda^2$ is respectively the quadratic differential coefficient for each wavelength of refractive index, l is the chip length of the laser chip, t is the effective thickness of the collimation lens, d is the interval of grooves of the diffraction grating, and $\alpha$ is the incident angle between collimated light and the diffraction grating, with the collimating light being incident.

4. A tunable external resonator laser which suppresses mode hop, said laser comprising:
a laser chip for emitting light;
a lens for collimating the light emitted from the laser;
a diffraction grating for diffracting the light collimated by the lens;
a half mirror for reflecting the light diffracted by the diffraction grating; and
a support body to which the half mirror is fixed,
wherein the diffraction grating is rotatable about a pivot located on an intersection line of planes containing surfaces of the half mirror and a first plane which is parallel to the diffraction grating surface, and
the offset $D_G$ of the diffraction grating surface and said pivot is determined by the following formula $$D_G = \left( \frac{d^2 n_1(\lambda)}{d\lambda^2} \bigg|_{\lambda_0} l + \frac{d^2 n_2(\lambda)}{d\lambda^2} \bigg|_{\lambda_0} t \right) \left( \sqrt{1 - \left( \frac{\lambda_0}{d} - \sin\alpha \right)^2} \right)^3 d^2$$

wherein $\lambda_0$ is a desired center wavelength, $n_1(\lambda)$ is the effective refractive index of waveguide mode of the laser chip, $n_2(\lambda)$ is the refractive index of the collimation lens, $d^2 n_1(\lambda)/d\lambda^2$ or $d^2 n_2(\lambda)/d\lambda^2$ is respectively the quadratic differential coefficient for each wavelength of the refractive index, l is the chip length of the laser chip, t is the effective thickness of the collimation lens, d is the interval of groove of the diffraction grating, $\alpha$ is the incident angle between collimated light and the diffraction grating, with the collimating light being incident.

5. A tunable external resonator laser which suppresses mode hop, said laser comprising:
a laser chip for emitting light;
a lens for collimating the light emitted from the laser;

a diffraction grating for diffracting the light collimated by the lens;

a support body to which the diffraction grating is fixed, and a movable mirror for reflecting the light diffracted by the diffraction grating, the movable mirror being rotatable about a pivot located on an intersection line of planes containing surfaces of the movable mirror and a first plane which is parallel to the diffraction grating surface, wherein an offset $D_G$ of the diffraction grating surface and said pivot is determined by the following formula $$D_G = \left(\frac{d^2 n_1(\lambda)}{d\lambda^2}\bigg|_{\lambda_0} l + \frac{d^2 n_2(\lambda)}{d\lambda^2}\bigg|_{\lambda_0} t\right)\left(\sqrt{1-\left(\frac{\lambda_0}{d}-\sin\alpha\right)^2}\right)^3 d^2$$

wherein $\lambda_0$ is a desired center wavelength, $n_1(\lambda)$ is the effective refractive index of a waveguide mode of the laser chip, $n_2(\lambda)$ is the refractive index of the collimation lens, $d^2 n_1(\lambda)/d\lambda^2$ or $d^2 n_2(\lambda)/d\lambda^2$ is respectively the quadratic differential coefficient for each wavelength of refractive index, l is the chip length of the laser chip, t is the effective thickness of the collimation lens, d is the interval of grooves of the diffraction grating, and $\alpha$ is the incident angle between collimated light and the diffraction grating, with the collimating light being incident.

6. A tunable external resonator laser which suppresses mode hop, said laser comprising:

a laser chip for emitting light;

a lens for collimating the light emitted from the laser chip;

a diffraction grating for diffracting the light collimated by the lens, a support body to which the diffraction grating is fixed, and a movable mirror for reflecting the light diffracted by the diffraction, wherein the movable mirror rotates on a pivot which is located on a first plane which is parallel to the diffraction grating surface, and an offset $D_G$ of the diffraction grating surface and said pivot is determined by the following formula $$D_G = \left(\frac{d^2 n_1(\lambda)}{d\lambda^2}\bigg|_{\lambda_0} l + \frac{d^2 n_2(\lambda)}{d\lambda^2}\bigg|_{\lambda_0} t\right)\left(\sqrt{1-\left(\frac{\lambda_0}{d}-\sin\alpha\right)^2}\right)^3 d^2,$$

wherein $\lambda_0$ is a desired center wavelength, $n_1(\lambda)$ is the effective refractive index of a waveguide mode of the laser chip, $n_2(\lambda)$ is the refractive index of the collimation lens, $d^2 n_1(\lambda)/d\lambda^2$ or $d^2 n_2(\lambda)/d\lambda^2$ is respectively a quadratic differential coefficient for each wavelength of refractive index, l is the chip length of the laser chip, t is the effective thickness of the collimation lens, d is the interval of grooves of the diffraction grating, and $\alpha$ is the incident angle between collimated light and the diffraction grating, with the collimating light being incident.

7. A tunable external resonator laser which suppresses mode hop, said laser comprising:

a laser chip for emitting light;

a lens for collimating the light emitted from the laser;

a diffraction grating for diffracting the light collimated by the lens;

a half mirror for reflecting the light diffracted by the diffraction grating; and a support body to which the half mirror is fixed, wherein the diffraction grating is rotatable about a pivot located on a first plane which is parallel to the diffraction grating surface, and the offset $D_G$ of the diffraction grating surface and said pivot is determined by the following formula $$D_G = \left(\frac{d^2 n_1(\lambda)}{d\lambda^2}\bigg|_{\lambda_0} l + \frac{d^2 n_2(\lambda)}{d\lambda^2}\bigg|_{\lambda_0} t\right)\left(\sqrt{1-\left(\frac{\lambda_0}{d}-\sin\alpha\right)^2}\right)^3 d^2$$

wherein $\lambda_0$ is a desired center wavelength, $n_1(\lambda)$ is the effective refractive index of waveguide mode of the laser chip, $n_2(\lambda)$ is the refractive index of the collimation lens, $d^2 n_1(\lambda)/d\lambda^2$ or $d^2 n_2(\lambda)/d\lambda^2$ is respectively the quadratic differential coefficient for each wavelength of the refractive index, l is the chip length of the laser chip, t is the effective thickness of the collimation lens, d is the interval of groove of the diffraction grating, $\alpha$ is the incident angle between collimated light and the diffraction grating, with the collimating light being incident.

* * * * *